United States Patent
Vaillancourt et al.

(10) Patent No.: US 12,068,266 B2
(45) Date of Patent: Aug. 20, 2024

(54) HYBRID COATING FOR INTEGRATED CIRCUIT DEVICE

(71) Applicant: Raytheon Company, Waltham, MA (US)

(72) Inventors: Jarrod N. Vaillancourt, South Hampton, NH (US); William J. Davis, Hollis, NH (US)

(73) Assignee: Raytheon Technologies Corporation, Tewksbury, MA (US)

( * ) Notice: Subject to any disclaimer, the term of this patent is extended or adjusted under 35 U.S.C. 154(b) by 124 days.

(21) Appl. No.: 17/561,113

(22) Filed: Dec. 23, 2021

(65) Prior Publication Data

US 2023/0207497 A1  Jun. 29, 2023

(51) Int. Cl.
| | |
|---|---|
| H01L 23/66 | (2006.01) |
| H01L 23/31 | (2006.01) |
| H01L 23/498 | (2006.01) |
| H01L 23/532 | (2006.01) |

(52) U.S. Cl.
CPC .......... *H01L 23/66* (2013.01); *H01L 23/3114* (2013.01); *H01L 23/49861* (2013.01)

(58) Field of Classification Search
CPC ... H01L 23/66; H01L 23/3171; H01L 23/3114
See application file for complete search history.

(56) References Cited

U.S. PATENT DOCUMENTS

| | | | |
|---|---|---|---|
| 5,654,589 A | 8/1997 | Huang et al. | |
| 7,602,599 B1* | 10/2009 | Hsu | H01G 4/30 361/306.3 |
| 7,902,674 B2 | 3/2011 | Chang et al. | |
| 8,969,176 B2 | 3/2015 | Fillmore et al. | |
| 10,002,836 B2 | 6/2018 | Spitzlsperger et al. | |
| 10,330,874 B2 | 6/2019 | Thadesar et al. | |
| 11,088,068 B2 | 8/2021 | Kuo et al. | |
| 2002/0113239 A1 | 8/2002 | Jochi et al. | |
| 2004/0029404 A1 | 2/2004 | Lin | |
| 2005/0118778 A1* | 6/2005 | Gau | H01L 23/5223 257/E21.011 |
| 2010/0013088 A1 | 1/2010 | Davis et al. | |

(Continued)

FOREIGN PATENT DOCUMENTS

| | | |
|---|---|---|
| CN | 109841579 A | 6/2019 |
| JP | 5536973 B2 | 5/2014 |

OTHER PUBLICATIONS

Ghalichechian, Nima, et al., "Permittivity and Loss Characterization of SU-8 Films for mmW and Terahertz Applications", IEEE Antennas and Wireless Propagation Letters, vol. 14, 2015, 723-726.

(Continued)

*Primary Examiner* — Walter H Swanson
*Assistant Examiner* — Jacob T Nelson
(74) *Attorney, Agent, or Firm* — Kinney & Lange, P.A.

(57) ABSTRACT

An interconnect layer for an integrated circuit device includes a low radio frequency (RF) loss primary coating that forms a main portion of the interconnect layer, an opening formed in the primary coating, a high aspect ratio patternable secondary coating within the opening, and a via formed in the secondary coating. An aspect ratio of the via is greater than an aspect ratio of the opening.

20 Claims, 6 Drawing Sheets

(56) References Cited

U.S. PATENT DOCUMENTS

| | | | |
|---|---|---|---|
| 2010/0213601 A1* | 8/2010 | Smeys | H01L 24/97 |
| | | | 257/713 |
| 2012/0139100 A1 | 6/2012 | Fillmore et al. | |
| 2012/0231622 A1* | 9/2012 | Chen | H01L 23/5329 |
| | | | 257/E21.575 |
| 2013/0154124 A1 | 6/2013 | Hallock et al. | |
| 2019/0067089 A1* | 2/2019 | Yang | H01L 23/5226 |
| 2019/0287898 A1 | 9/2019 | Suo et al. | |
| 2019/0341306 A1 | 11/2019 | Yu et al. | |

OTHER PUBLICATIONS

"Material Safety Data Sheet", MicroChem, May 27, 2008, 7 pages.
"Processing Guidelines for SU-8 2000," MicroChem, 5 pages.
International Search Report and Written Opinion for PCT Application No. PCT/US2022/053809, dated Apr. 4, 2023, 10 pages.

\* cited by examiner

HYBRID COATING FOR INTEGRATED CIRCUIT DEVICE

BACKGROUND

This disclosure relates generally to integrated circuit devices, and more specifically to coatings for integrated circuit devices.

Integrated circuit devices have broad applications across numerous industries. For example, monolithic microwave integrated circuits (MMICs) are a type of integrated circuit device typically used for microwave mixing, power amplification, low-noise amplification, and high-frequency switching. Integrated circuit devices can transmit and receive radio frequency (RF) signals. As such, integrated circuit devices can include various RF features on the device surface. Exposed features can become damaged with handling, so coatings may be used to protect the integrated circuit device.

SUMMARY

In one example, an interconnect layer for an integrated circuit device includes a low radio frequency (RF) loss primary coating that forms a main portion of the interconnect layer, an opening formed in the primary coating, a high aspect ratio patternable secondary coating within the opening, and a via formed in the secondary coating. An aspect ratio of the via is greater than an aspect ratio of the opening.

In another example, an integrated circuit device includes a wafer, a low radio frequency (RF) loss primary coating at least partially covering the wafer, an opening formed in the primary coating to expose a feature that is positioned on the wafer, a high aspect ratio patternable secondary coating within the opening, and a via formed in the secondary coating. An aspect ratio of the via is greater than an aspect ratio of the opening.

In another example, a method of reducing radio frequency (RF) loss from an integrated circuit device includes depositing a low RF loss primary coating onto an integrated circuit device wafer, forming an opening in the primary coating to expose a feature that is positioned on the wafer, depositing a high aspect ratio patternable secondary coating into the opening, and forming a via in the secondary coating.

DETAILED DESCRIPTION

According to techniques of this disclosure, a hybrid coating for an integrated circuit device includes a low radio frequency (RF) loss coating that defines a low aspect ratio opening and a high aspect ratio patternable coating that fills the low aspect ratio opening and defines a high aspect ratio via therein. The hybrid coating with the high aspect ratio via can reduce RF loss at high frequencies and permit feature compaction on the integrated circuit device wafer surface. The integrated circuit device hybrid coating disclosed herein and a corresponding method of fabrication are described below with reference to FIGS. 1-5.

Figure 1:
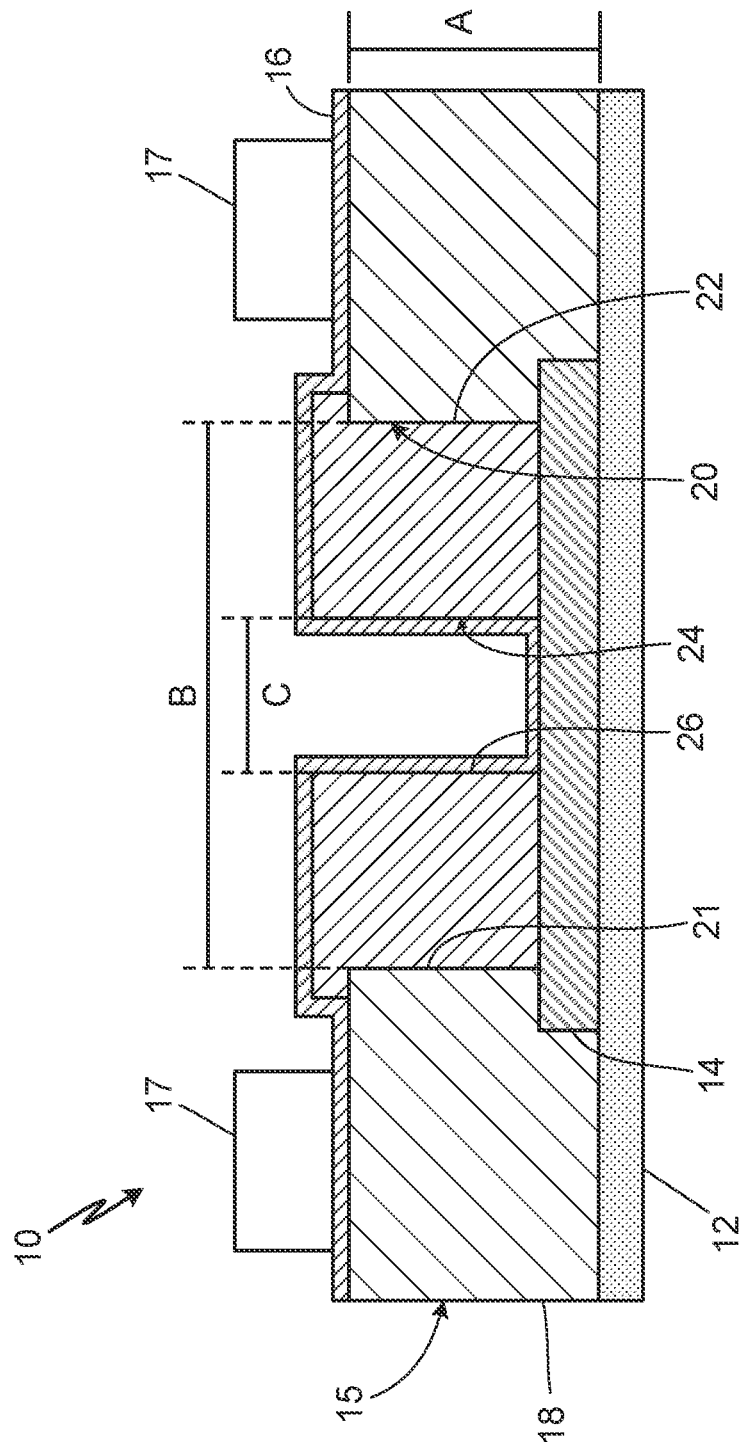
FIG. 1 is a schematic cross-sectional side view of an integrated circuit device with a hybrid coating and a high aspect ratio via.

FIG. 1 is a schematic cross-sectional side view of integrated circuit device 10 with hybrid coating 15 and high aspect ratio via 24. Integrated circuit device 10 includes wafer 12, contact 14, hybrid coating 15, interconnect 16, and topside features 17. Hybrid coating 15 includes primary coating 18, which defines opening 20 and has sidewalls 21, and secondary coating 22, which defines via 24 and has sidewalls 26. Also labeled in FIG. 1 are hybrid coating thickness A, opening width B, and via width C.

Wafer 12 is a first, or base, layer of integrated circuit device 10. Wafer 12 can be a thin slice of semiconductor, such as a crystalline silicon (Si), silicon carbide (SiC), gallium nitride (GaN) on Si, or GaN on SiC, to name a few non-limiting examples. Wafer 12 can serve as a substrate for microelectronic features built in and/or on wafer 12. For example, radio frequency (RF) features or transmission lines may be formed on a top side of wafer 12. RF features on the top side of wafer 12 can transmit and/or receive RF signals. Wafer 12, as depicted schematically in FIG. 1, can represent a finished circuit of integrated circuit device 10.

Hybrid coating 15 extends across and coats the top side of wafer 12. Accordingly, hybrid coating 15 is a second layer of integrated circuit device 10. Any microelectronic features formed on the top side of wafer 12 can be between wafer 12 and hybrid coating 15. Hybrid coating 15 can be a protective coating that covers the top side of wafer 12 such that any microelectronic features built in and/or on wafer 12 are not exposed.

Hybrid coating 15 can also be an interconnect layer of integrated circuit device 10. For example, topside features 17 can be positioned on a top surface of hybrid coating 15. Topside features 17 can be any microelectronic features, such as transformers, inductors, other features, or any combination of features. For simplicity, topside features 17 are represented schematically in FIG. 1 as boxes behind the cross-section plane. FIG. 1 shows integrated circuit device 10 with two topside features 17; however, other examples can include more or fewer topside features 17. In yet other examples, integrated circuit device 10 may not include any topside features 17. Integrated circuit device 10 can include any suitable number of topside features 17. Topside features 17 can form an additional functional layer of integrated circuit device 10 on the top surface of hybrid coating 15 and have connections that extend through hybrid coating 15 to wafer 12 (e.g., interconnect 16 described below). In such examples, hybrid coating 15 is configured to be positioned between wafer 12 and the additional functional layer.

Hybrid coating 15 includes primary coating 18 and secondary coating 22. Primary coating 18 is a primary coating of hybrid coating 15. Primary coating 18 can be a low RF loss material (i.e., a material with a low RF loss tangent). Specifically, primary coating 18 can be a benzocyclobutene (BCB)-based polymer. BCB-based polymers can be photo-imageable, or photosensitive, dielectrics suitable for thin film microelectronics applications. For example, one group of BCB-based polymers is commercially available from Kayaku Advanced Materials, Inc., 200 Flanders Road, Westborough, MA 01581 USA, under the trade name CYCLOTENE (Trademark of the Dow Chemical Company) 4000 Series.

Primary coating 18 extends over the top side of wafer 12 and forms a main portion of hybrid coating 15, thereby forming a main portion of the interconnect layer of integrated circuit device 10. Primary coating 18 can cover more surface area on the top side of wafer 12 compared to secondary coating 22. For example, primary coating 18 can cover all or almost all of the top side of wafer 12 except for portions or features exposed by opening 20, as will be described in greater detail below.

As shown in FIG. 1, hybrid coating 15 has thickness A. Thickness A is measured from a top surface (at the top side) of wafer 12 to the top surface of hybrid coating 15 at primary coating 18 (i.e., a top surface of primary coating 18). Thus, thickness A can represent a thickness of primary coating 18. Thickness A can depend on a desired application of integrated circuit device 10 and/or properties of hybrid coating 15 (i.e., primary coating 18 and/or secondary coating 22). For example, thickness A can depend on a desired RF loss tangent of primary coating 18. In some examples, thickness A can be greater than 15 micrometers (μm). In some examples, thickness A can be greater than 20 μm. In some examples, thickness A can be about 20-30 μm. In some examples, thickness A can be about 24-25 μm. In yet other examples, thickness A can be 30 μm or greater.

Opening 20 is a channel, or trench, formed in primary coating 18 of hybrid coating 15. Opening 20 can extend through primary coating 18 to the top side of wafer 12 or to a feature positioned on the top side of wafer 12 and exposed by opening 20 (e.g., contact 14 described below). A height of opening 20 that is measured from the top side of wafer 12 rather than from a top side of the features on wafer 12 can be referred to as an effective height of opening 20. The effective height of opening 20 is a convenient measurement for purposes of determining an aspect ratio because the thickness of features such as contact 14 may vary. Moreover, because opening 20 extends through primary coating 18, the effective height of opening 20 can be generalized as thickness A.

Opening 20 also defines width B. Opening width B can depend on properties of primary coating 18. In some examples, width B can be greater than 15 μm. In some examples, width B can be about 40-60 μm. Width B can be greater than thickness A. That is, opening 20 can have an aspect ratio (e.g., a ratio of thickness A to width B) that is less than 1.0. In some examples, the aspect ratio of opening 20 is about 0.6. Opening 20 can be referred to as a low aspect ratio opening.

Opening 20 is defined in primary coating 18 by sidewalls 21. Sidewalls 21 are depicted schematically in FIG. 1 as being straight and extending perpendicularly to wafer 12. That is, opening 20 has a consistent width (width B) along the height of opening 20. In other examples, sidewalls 21 may be angled, or tapered (as described below with respect to FIG. 2). In yet other examples, sidewalls 21 may have contoured, or rounded, edges near either end of opening 20. In still other examples, sidewalls 21 can have any suitable profile based on the properties of primary coating 18.

Secondary coating 22 is a secondary coating of hybrid coating 15. Secondary coating 22 has a different composition than primary coating 18. Secondary coating 22 can be a high aspect ratio patternable material (i.e., a material that is capable of being patterned to form high aspect ratio features). Secondary coating 22 can also be a relatively high RF loss material (i.e., a material with a high RF loss tangent) compared to primary coating 18, i.e., secondary coating 22 can have a higher RF loss tangent than primary coating 18. Specifically, secondary coating 22 can be a high contrast, epoxy-based, negative photoresist possessing an average of eight epoxide functional groups per moiety that is commercially available from Kayaku Advanced Materials, Inc., 200 Flanders Road, Westborough, MA 01581 USA, under the trade name SU-8 #### with different viscosities (e.g., SU-8 5, SU-8 10, SU-8 25, SU-8 50, SU-8 100, etc.) (referred to generically herein as "SU-8" for simplicity). Material attributes of SU-8 include suitability for high aspect ratio imaging with near vertical sidewalls in thick films due to its high optical transparency at wavelengths above 360 nanometers (nm) (near UV radiation) and capability of forming films with thicknesses up to 200 micrometers (μm) in a single spin coat process. Cross-linked portions of an SU-8 film are rendered insoluble to liquid developers. SU-8 is typically used for permanent applications, e.g., where high chemical and temperature resistance is desired.

Figure 2:
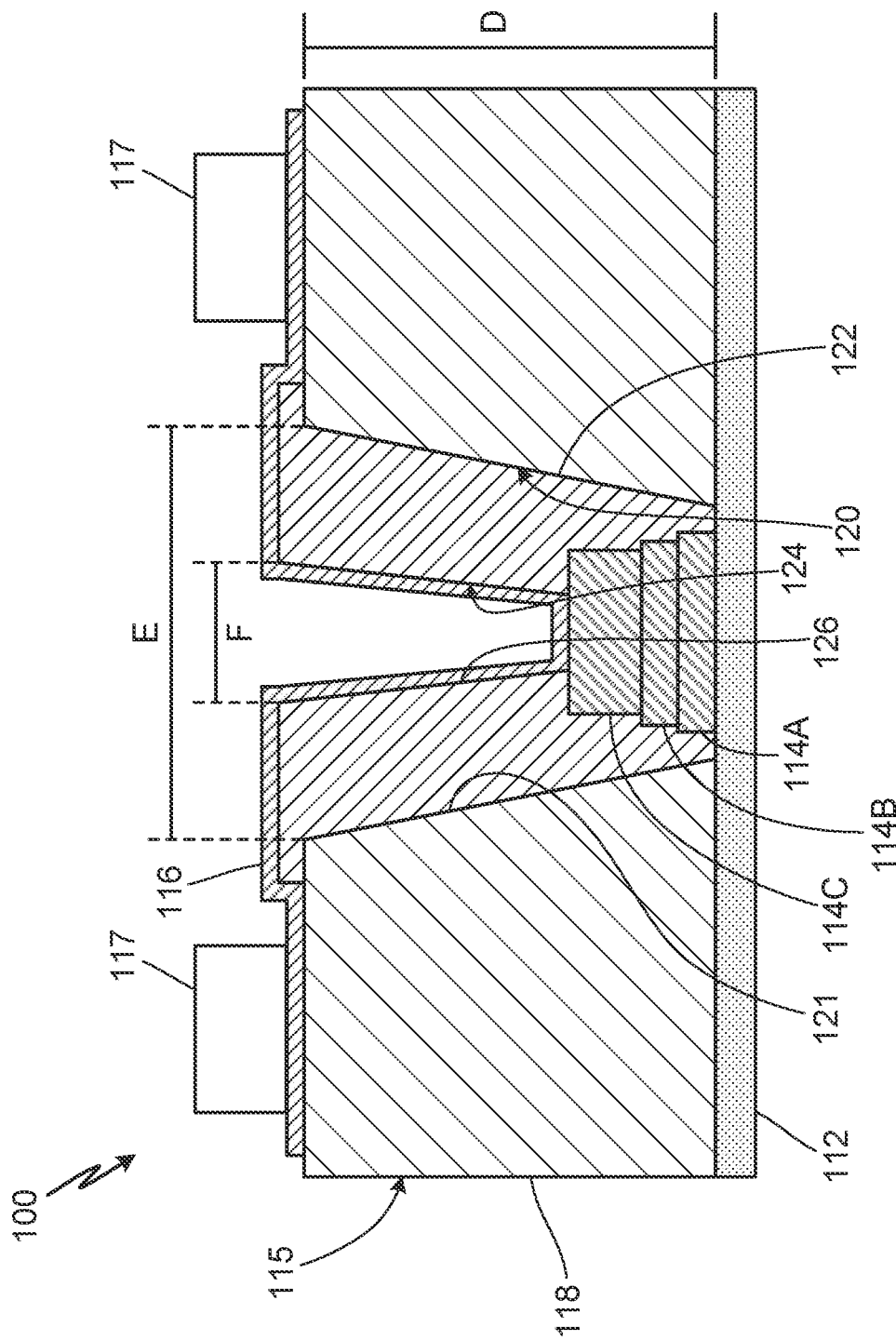
FIG. 2 is a schematic cross-sectional view of an integrated circuit device with a hybrid coating and a tapered high aspect ratio via.

Secondary coating 22 is within opening 20 of primary coating 18. Thus, secondary coating 22 can cover less surface area on the top side of wafer 12 compared to primary coating 18. For example, secondary coating 22 may only cover portions or features of the top side of wafer 12 that are exposed by opening 20. Secondary coating 22 can extend at least the entire height of opening 20. As such, secondary coating can contact the top side of wafer 12 (as shown in FIG. 2) and/or features positioned on the top side of wafer 12 (e.g., contact 14 described below). A thickness of secondary coating 22 that is measured from the top side of wafer 12 rather than from a top side of the features on wafer 12 can be referred to as an effective thickness of secondary coating 22. The effective thickness of secondary coating 22 is a convenient measurement for purposes of determining an aspect ratio because the thickness of features such as contact 14 may vary. In some examples, secondary coating 22 is at least as thick as primary coating 18 (based on the effective thickness of secondary coating 22). In such examples, the effective thickness of secondary coating 22 can be generalized as thickness A. In other examples, secondary coating 22 extends above the top surface of primary coating 18, and the effective thickness of secondary coating 22 can be greater than thickness A.

Via 24 is an opening, or channel, formed in secondary coating 22 of hybrid coating 15. Via 24 can extend through secondary coating 22 to the top side of wafer 12 or to a feature positioned on the top side of wafer 12 and exposed by via 24 (e.g., contact 14 described below). A height of via 24 that is measured from the top side of wafer 12 rather than from a top side of the features on wafer 12 can be referred to as an effective height of via 24. The effective height of via 24 is a convenient measurement for purposes of determining an aspect ratio because the thickness of features such as contact 14 may vary. Moreover, because via 24 extends through secondary coating 22, the effective height of via 24 can be generalized as thickness A in examples wherein secondary coating 22 is at least as thick as primary coating 18 (based on the effective thickness of secondary coating 22). In other examples wherein secondary coating 22 extends above the top surface of primary coating 18, the effective height of via 24 can be greater than thickness A.

Via 24 also defines width C. Via width C can depend on properties of secondary coating 22. In some examples, width C can be less than 60 μm. In some examples, width C can be less than 30 μm. In some examples, width C can be less than 20 μm. In some examples, width C can be about 15 μm. Width C can be sufficient to accommodate a desired thickness of a material that is coated on sidewalls 26 of via 24 (e.g., interconnect 16 described below) while still providing an opening through secondary coating 22. An aspect ratio of via 24 (e.g., a ratio of thickness A to width C) can be greater than the aspect ratio of opening 20. For example, the aspect ratio of via 24 can be greater than 0.6. Moreover, width C can be less than or equal to thickness A. That is, the aspect ratio of via 24 can be greater than or equal to 1.0. In some examples, the aspect ratio of via 24 ranges from 5:1 to 25:1. Via 24 can be referred to as a high aspect ratio via.

Via 24 is defined in secondary coating 22 by sidewalls 26. Sidewalls 26 are depicted schematically in FIG. 1 as being straight and extending perpendicularly to wafer 12. That is, via 24 has a consistent width (width C) along the height of via 24. In other examples, sidewalls 26 may be angled, or tapered (as described below with respect to FIG. 2). In yet other examples, sidewalls 26 may have contoured, or rounded, edges near either end of via 24. In still other examples, sidewalls 26 can have any suitable profile based on the properties of secondary coating 22.

Contact 14 is positioned on the top side of wafer 12. Contact 14 is an electrical contact material. For example, contact 14 can be metallic. Contact 14 is positioned such that opening 20 and via 24 are above contact 14. In other words, opening 20 and via 24 are openings through hybrid coating 15 (through primary coating 18 and secondary coating 22, respectively) to contact 14. Contact 14 can have any suitable size based on the desired spacing of features on wafer 12. As shown in FIG. 1, contact 14 can have a greater width than via width C. Thus, a portion of contact 14 can be between wafer 12 and hybrid coating 15. For example, a portion of contact 14 can be between wafer 12 and both primary coating 18 and secondary coating 22 (as shown in FIG. 1) or a portion of contact 14 can be between wafer 12 and secondary coating 22 but not primary coating 18 (as shown in FIG. 2).

Contact 14 forms an electrical connection with interconnect 16. Interconnect 16 is an electrically conductive material. For example, interconnect 16 can be metallic. Interconnect 16 forms a layer on a top side of hybrid coating 15 (opposite a side of hybrid coating 15 that is in contact with wafer 12) and on sidewalls 26, e.g., interconnect 16 can be a topside metal layer. Specifically, interconnect 16 extends from the top side of hybrid coating 15 through via 24 along sidewalls 26 to contact 14. Interconnect 16 provides for electrical connection between microelectronic features on the top side of wafer 12 and other features, such as transformers or inductors, for example, that can be positioned on the top side of hybrid coating 15.

In operation, a radio frequency (RF) signal (or multiple RF signals) can be transmitted or received through hybrid coating 15 by integrated circuit device 10. The RF signal can be a high frequency RF signal. For example, integrated circuit device 10 can have an operating frequency that is greater than 10 GHz. In some examples, integrated circuit device 10 can be a monolithic microwave integrated circuit (MMIC), which operates at microwave frequencies. Because primary coating 18 of hybrid coating 15 covers a greater portion of wafer 12 than secondary coating 22, the RF signal from integrated circuit device 10 primarily encounters primary coating 18 as it travels in the plane of wafer 12. The RF signal only encounters secondary coating 22 at the limited regions on wafer 12 where secondary coating 22 fills opening 20. Some of the RF signal may be lost to primary coating 18 and/or secondary coating 22. The RF loss tangent is a figure in the RF loss calculation through a particular material, with energy being lost in proportion to the RF loss tangent. A lower RF loss tangent means less signal is lost into the material. The amount of RF loss from integrated circuit device 10 depends on the RF loss tangent of primary coating 18 and secondary coating 22.

Hybrid coating 15 also protects features on the top side of wafer 12 from becoming scratched or damaged by handling of integrated circuit device 10. When features of integrated circuit device 10 are damaged, integrated circuit device 10 may become unusable and need to be replaced, which can be expensive and time-consuming.

Integrated circuit devices, such as integrated circuit device 10, have broad applications across numerous industries. Coatings are desirable to protect circuit features, but there can be significant tradeoffs between feature spacing and RF loss of the device, depending on the coating materials that are used.

BCB-based polymers have a low RF loss tangent and are capable of low-resolution (i.e., low aspect ratio) patterning. More specifically, there is an inverse relationship between the RF loss tangent and a thickness of a BCB-based polymer. For example, doubling the thickness of the BCB-based polymer to have a thicker BCB layer (e.g., primary coating 18) can halve the corresponding RF loss tangent. Thus, primary coating 18 is suitable for coating a majority of wafer 12 to support long-haul, end-to-end RF signal transmission. However, the thicker BCB layer will necessitate wider openings in the BCB layer (e.g., opening 20) due to aspect ratio requirements of the material. Wider openings in turn necessitate larger contacts (e.g., contact 14) on the wafer surface and increase inductance, which leads to increased RF loss from the device.

On the other hand, SU-8 is capable of high-resolution (i.e., high aspect ratio) patterning. For example, SU-8 permits patterning of features with aspect ratios up to about 200:1. However, SU-8 has an RF loss tangent that is generally around an order of magnitude greater than the RF loss tangent for a BCB-based polymer of equal thickness. Increasing a thickness of an SU-8 layer (e.g., secondary coating 22) can dramatically increase RF loss. Thus, secondary coating 22 is less effective than primary coating 18 for covering an entirety (or a majority) of wafer 12 because RF loss would be increased across a greater portion of the device.

Hybrid coating 15 leverages the properties of primary coating 18 and secondary coating 22 in combination to improve performance of integrated circuit device 10. Integrated circuit device 10 retains the benefit of low RF loss over a majority of the surface of wafer 12 due to the low RF loss tangent of primary coating 18, which covers a majority of the surface of wafer 12. That is, the relatively higher RF loss tangent of secondary coating 22 will not significantly impact the loss of the end product because the RF signal lines are in contact with secondary coating 22 for such a short distance relative to primary coating 18. Integrated circuit device 10 also retains the benefit of high aspect ratio patterning to form high aspect ratio features (e.g., via 24) due to strategic use of secondary coating 18 in limited locations (e.g., within opening 20). Using only one or the other of primary coating 18 and secondary coating 22 in place of hybrid coating 15 could increase the RF loss of integrated circuit device 10 and negatively impact performance.

Hybrid coating 15 permits formation of high aspect ratio via 24 on integrated circuit device 10, which enables a layer of hybrid coating 15 to be used as an interconnect layer for connecting features on top of wafer 12 to features on top of hybrid coating 15 through via 24. When used in this way, hybrid coating 15 also permits feature compaction on the surface of wafer 12. Specifically, contact 14 must be wider than an opening of via 24 because via 24 must land within the exposed surface area of contact 14 during fabrication. Accordingly, another connection (another via) must be separated from via 24 based at least partly on the size of contact 14. Using larger contacts to accommodate wider (e.g., low aspect ratio) vias means individual vias must be spaced farther apart, and signal strength will be lost on the wafer, especially at high frequencies. High aspect ratio via 24 can be narrower than a conventional via formed in a material such as BCB, so adjacent vias and underlying features can be positioned nearer to via 24 on the surface of wafer 12. That is, adjacent vias 24 can be positioned closer together in hybrid coating 15 than equivalent vias on a wafer with only primary coating 18 (e.g., BCB). This feature compaction on the top side of wafer 12 that is enabled by hybrid coating 15 with high aspect ratio via 24 can allow for a greater density of features on integrated circuit device 10 and/or a smaller device overall.

RF loss can have the most significant impact on performance of an integrated circuit device at high frequencies and applications where it is desirable to have the most powerful signal possible. Thus, hybrid coating 15 with high aspect ratio via 24 can be particularly useful for high frequency applications of integrated circuit device 10. For example, hybrid coating 15 with high aspect ratio via 24 could benefit 5G broadband cellular network technologies and other high frequency GaN on SiC or GaN on Si MMICs.

FIG. 2 is a schematic cross-sectional view of integrated circuit device 100 with hybrid coating 115 and tapered high aspect ratio via 124. Integrated circuit device 100 includes wafer 112, contacts 114A-114C, hybrid coating 115, interconnect 116, and topside features 117. Hybrid coating 115 includes primary coating 118, which defines tapered opening 120 and has angled sidewalls 121, and secondary coating 122, which defines tapered via 124 and has angled sidewalls 126. Also labeled in FIG. 1 are hybrid coating thickness D, opening width E, and via width F. Integrated circuit device 100 has essentially the same structure and function as described above with reference to integrated circuit device 10 in FIG. 1, except integrated circuit device 100 includes a stack of contacts 114A-114C, tapered opening 120 with angled sidewalls 121, and tapered via 124 with angled sidewalls 126, rather than a straight-walled opening and/or via (e.g., as shown in FIG. 1).

Depending on the desired characteristics of integrated circuit device 100, it may be desirable to utilize a stack of contacts 114A-114C instead of a single contact (e.g., contact 14 in FIG. 1). The stack of contacts 114A-114C has essentially the same structure and function within integrated circuit device 100 as contact 14 in integrated circuit device 10 (shown in FIG. 1). Contacts 114A-114C are stacked on a top side of wafer 112. Each of contacts 114A-114C is an electrical contact material. For example, each of contacts 114A-114C can be an individual layer of metal, which together form the stack of contacts 114A-114C. The stack of contacts 114A-114C is positioned such that opening 120 and via 124 are above contacts 114A-114C. A top one of contacts 114A-114C (e.g., contact 114C in FIG. 2) is exposed by via 124, and the top one of contacts 114A-114C can form an electrical connection with interconnect 116. FIG. 2 shows integrated circuit device 100 with three contacts 114A-114C; however, other examples can include more or fewer contacts 114. Integrated circuit device 100 can include any suitable number of contacts 114.

Contacts 114A-114C can have any suitable size based on the desired spacing of features on wafer 112. Each of contacts 114A-114C can have same or different dimensions. As shown in FIG. 2, contacts 114A-114C can have a greater width than via width F. Thus, a portion of contacts 114A-114C can be between wafer 112 and hybrid coating 115. For example, a portion of contacts 114A-114C can be between wafer 112 and secondary coating 122 but not primary coating 118 (as shown in FIG. 2), or a portion of contacts 114A-114C can be between wafer 112 and both primary coating 118 and secondary coating 122 (as shown in FIG. 1). Each of contacts 114A-114C can extend laterally a same or different distance into secondary coating 122 and primary coating 118.

A height of opening 120 and a height of via 124 can be measured from the top side of wafer 112 (an effective height of opening 120 and an effective height of via 124) rather than from a top side of contacts 114A-114C because a thickness of contacts 114A-114C can vary. Moreover, the height of opening 120 varies along the width of opening 120 (width E) when contacts 114A-114C do not have equal widths (as shown in FIG. 2). Thus, the effective height of opening 120 and the effective height of via 124 are convenient measurements for purposes of determining an aspect ratio of opening 120 and via 124.

Opening 120 is defined in primary coating 118 by sidewalls 121. Sidewalls 121 are angled or tapered. A first end of opening 120 is wider than a second end of opening 120 that is adjacent a top surface of wafer 112 and/or a feature (such as contacts 114A-114C) positioned on the top side of wafer 112. In other words, opening 120 becomes progressively narrower towards wafer 112. An aspect ratio of opening 120 can be determined as described above with respect to opening 20 in FIG. 1, and a relevant width of opening 120 for the aspect ratio (e.g., width E) can be measured at any point along sidewalls 121. For simplicity, width E is depicted in FIG. 2 at the first end of opening 120. In some examples, width E may be measured from a midpoint along sidewalls 121.

Like sidewalls 21 shown in FIG. 1, sidewalls 121 may also have contoured, or rounded, edges near either end of opening 120. Sidewalls 121 can have any suitable profile based on the properties of primary coating 118. For example, an angle of tapered sidewalls 121 can depend on material properties of primary coating 118.

Similarly, via 124 is defined in secondary coating 122 by sidewalls 126. Sidewalls 126 are angled or tapered. A first end of via 124 is wider than a second end of via 124 that is adjacent the top surface of wafer 112 and/or a feature (such as contacts 114A-114C) positioned on the top side of wafer 112. In other words, via 124 becomes progressively narrower towards wafer 112. An aspect ratio of via 124 can be determined as described above with respect to via 24 in FIG. 1, and a relevant width of via 124 for the aspect ratio (e.g., width F) can be measured at any point along sidewalls 126. For simplicity, width F is depicted in FIG. 2 at the first end of via 124. In some examples, width F may be measured from a midpoint along sidewalls 126.

Like sidewalls 26 shown in FIG. 1, sidewalls 126 may also have contoured, or rounded, edges near either end of via 124. Sidewalls 126 can have any suitable profile based on the properties of secondary coating 122. For example, an angle of tapered sidewalls 126 can depend on material properties of secondary coating 122. As such, the angle of tapered sidewalls 126 can be the same or different from the angle of tapered sidewalls 121. In some examples (as shown in FIG. 2), tapered sidewalls 126 can be steeper than tapered sidewalls 121 (i.e., the angle of tapered sidewalls 126 can be greater than the angle of tapered sidewalls 121).

Hybrid coating 115 leverages the properties of primary coating 118 and secondary coating 122 in combination to improve performance of integrated circuit device 100. Integrated circuit device 100 retains the benefit of low RF loss over a majority of the surface of wafer 112 due to the low RF loss tangent of primary coating 118, which covers a majority of the surface of wafer 112. Integrated circuit device 100 also retains the benefit of high aspect ratio patterning to form high aspect ratio features (e.g., via 124) due to strategic use of secondary coating 118 in limited locations (e.g., within opening 120). Using only one or the other of primary coating 118 and secondary coating 122 in place of hybrid coating 115 would increase the RF loss of integrated circuit device 100 and negatively impact performance.

Hybrid coating 115 permits formation of high aspect ratio via 124 on integrated circuit device 100, which enables a layer of hybrid coating 115 to be used as an interconnect layer for connecting features on top of wafer 112 to features on top of hybrid coating 115 through via 124. When used in this way, hybrid coating 115 also permits feature compaction on the surface of wafer 112. Specifically, contacts 114A-114C must be wider than an opening of via 124 because via 124 must land within the exposed surface area of the stack of contacts 114A-114C during fabrication. Accordingly, another connection (another via) must be separated from via 124 based at least partly on the size of contacts 114A-114C. Using larger contacts to accommodate wider (e.g., low aspect ratio) vias means individual vias must be spaced farther apart, and signal strength will be lost on the wafer, especially at high frequencies. High aspect ratio via 124 can be narrower than a conventional via formed in a material such as BCB, so adjacent vias and underlying features can be positioned nearer to via 124 on the surface of wafer 112. That is, adjacent vias 124 can be positioned closer together in hybrid coating 115 than equivalent vias on a wafer with only primary coating 118 (e.g., BCB). This feature compaction on the top side of wafer 112 that is enabled by hybrid coating 115 with high aspect ratio via 124 can allow for a greater density of features on integrated circuit device 100 and/or a smaller device overall.

RF loss can have the most significant impact on performance of an integrated circuit device at high frequencies and where it is desirable to have the most powerful signal possible. Thus, hybrid coating 115 with high aspect ratio via 124 can be particularly useful for high frequency applications of integrated circuit device 100. For example, hybrid coating 115 with high aspect ratio via 124 could benefit 5G broadband cellular network technologies and other high frequency GaN on SiC or GaN on Si MMICs.

Figure 3:
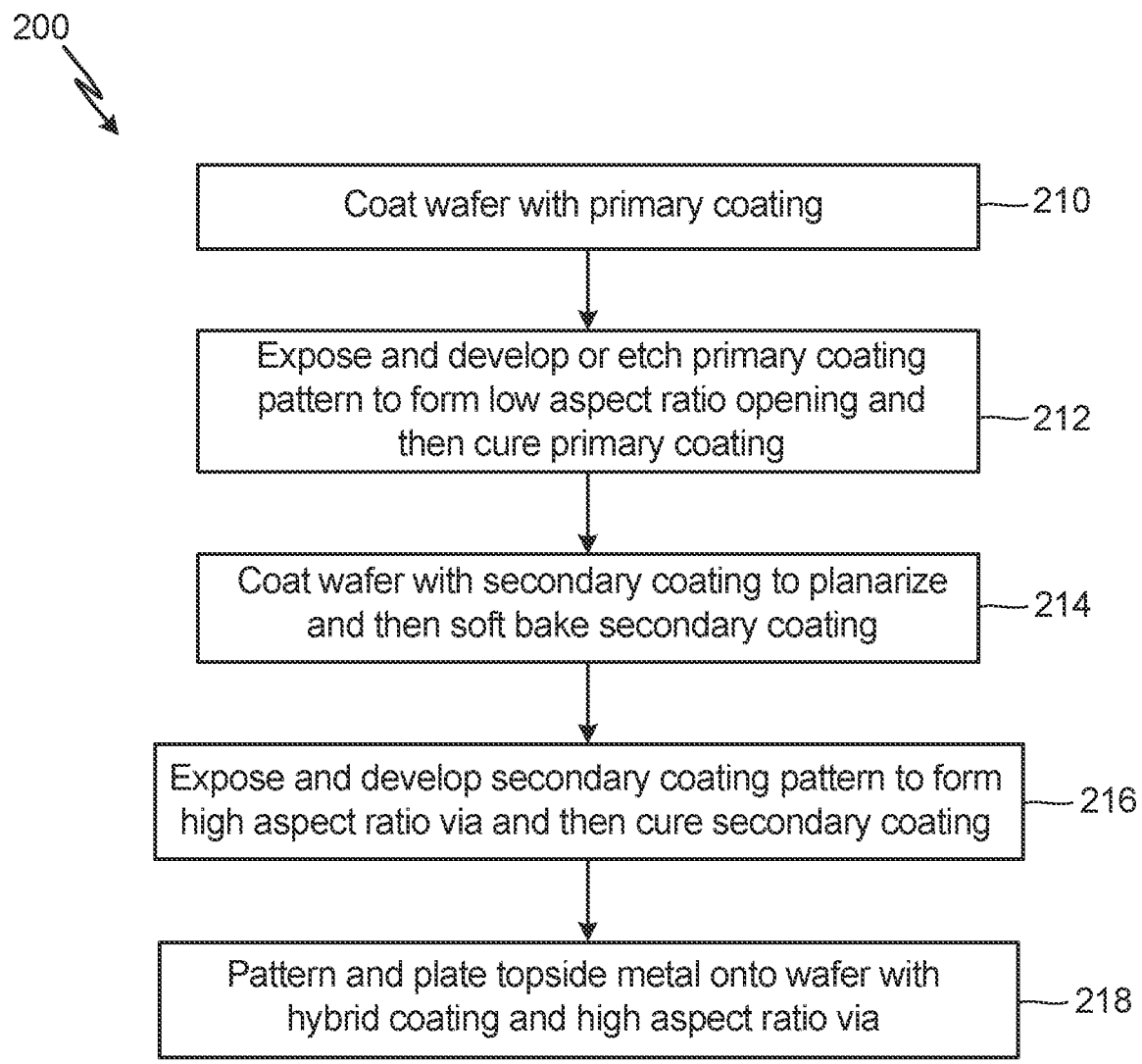
FIG. 3 is a process flow diagram showing steps for fabricating the hybrid coating and the high aspect ratio via for the integrated circuit device.

Fabrication of an integrated circuit device with a hybrid topside coating and a high aspect ratio via (e.g., integrated circuit devices 10 and 100) will be described with reference to FIGS. 3-4F. In this section, sequential iterations of work in process (WIP) features will be indicated with sequential lettering (e.g., "300A," "300B," etc.), and WIP features may be referred to generally by the shared reference number.

For ease of discussion, FIGS. 3-4F will be described together. FIG. 3 is a process flow diagram showing steps of process 200 for fabricating a hybrid coating and a high aspect ratio via for an integrated circuit device (e.g., for integrated circuit devices 10 and 100 shown in FIGS. 1 and 2, respectively). FIGS. 4A-4F are schematic cross-sectional side views illustrating steps 210-218 for fabricating hybrid coating 320 and high aspect ratio via 322 for integrated circuit device WIP 300. Integrated circuit device WIP 300 and its component parts are substantially similar in structure to integrated circuit devices 10 and 100 and their component parts (as described above with reference to FIGS. 1 and 2, respectively), except where in-process differences are noted.

Figure 4A:
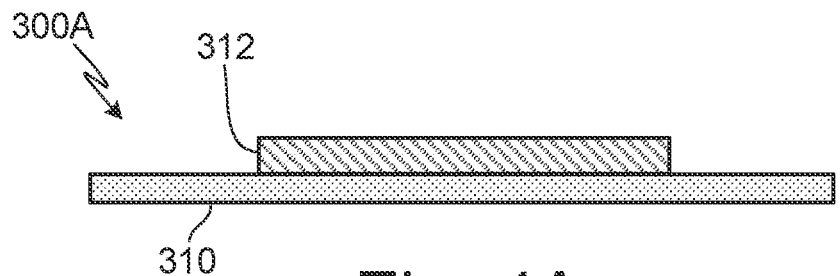
FIGS. 4A-4F are schematic cross-sectional side views illustrating steps for fabricating the hybrid coating and the high aspect ratio via for the integrated circuit device.
Figure 4B:
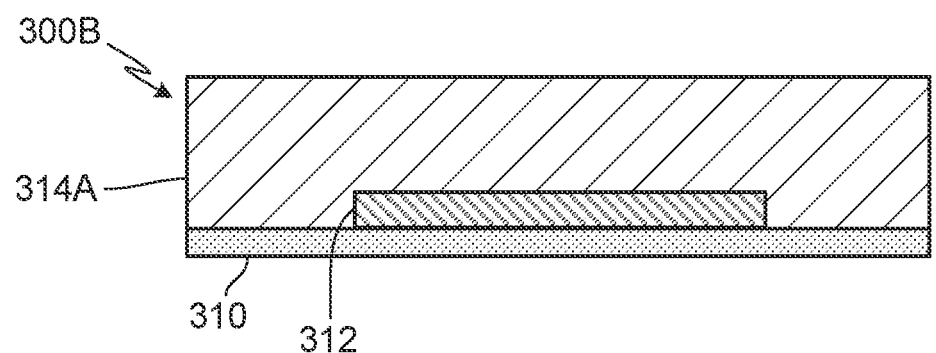

FIG. 4A shows integrated circuit device WIP 300A including wafer 310 and contact 312 positioned thereon. At step 210 of process 200, wafer 310 is coated with primary coating 314A to form integrated circuit device WIP 300B (shown in FIG. 4B). For example, primary coating 314A can be spun onto wafer 310 or deposited via any other process suitable for depositing BCB. Primary coating 314A forms a layer over a top side of wafer 310 and contact 312.

Figure 4C:
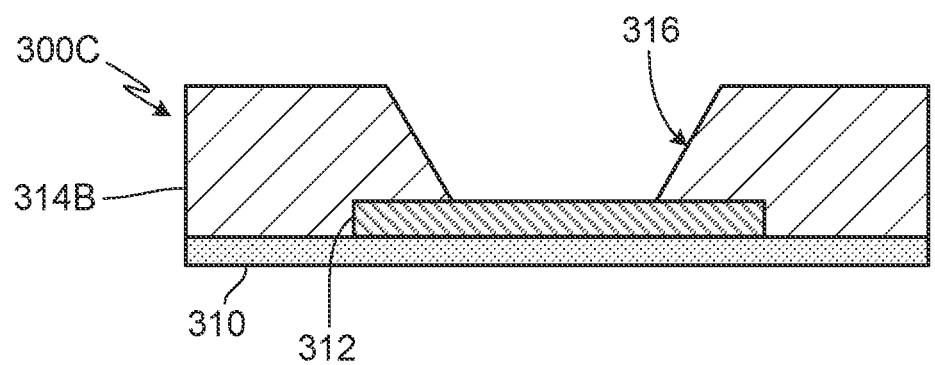

At step 212, primary coating 314A is exposed and developed, etched, or a combination of developing and etching to pattern primary coating 314A and form low aspect ratio opening 316. Selecting a developing or etching process can depend on properties of primary coating 314A. After forming low aspect ratio opening 316, primary coating 314A can be cured. Additional processing steps of primary coating 314A can be included prior to curing primary coating 314A, depending on a desired yield. As shown in FIG. 4C, the resulting integrated circuit device WIP 300C includes cured primary coating 314B patterned with low aspect ratio opening 316.

Figure 4D:
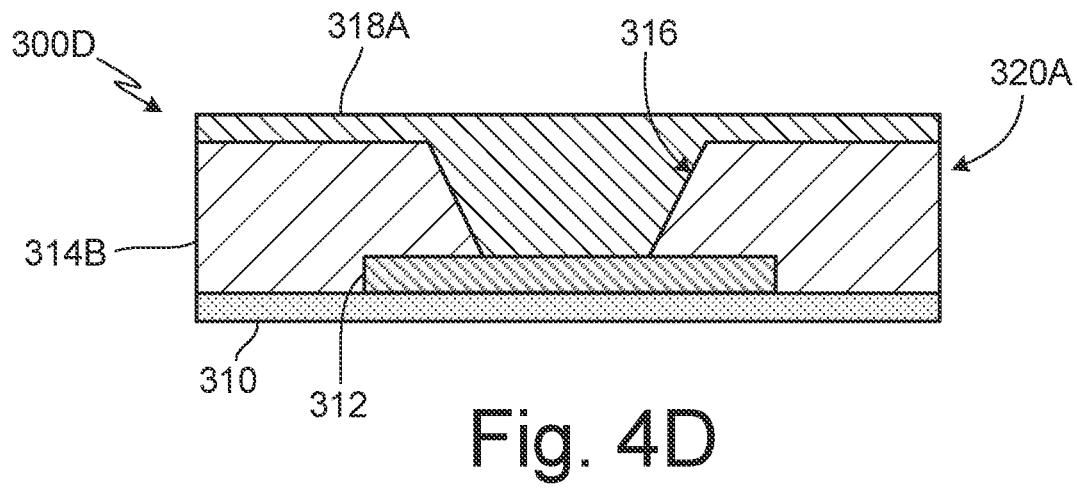

At step 214, primary coating 314B on wafer 310 is coated with secondary coating 318A to planarize integrated circuit device WIP 300C and form integrated circuit device WIP 300D with hybrid coating 320A (shown in FIG. 4D). For example, secondary coating 318A can be spun onto wafer 310 (on top of primary coating 314B) or deposited via any other process suitable for depositing SU-8, and then secondary coating 318A can be soft baked. Secondary coating 318A is not deposited until after low aspect ratio opening 316 is already formed in primary coating 314. Secondary coating 318A can completely fill low aspect ratio opening 316. Hybrid coating 320A includes primary coating 314B, low aspect ratio opening 316, and secondary coating 318A.

Figure 4E:
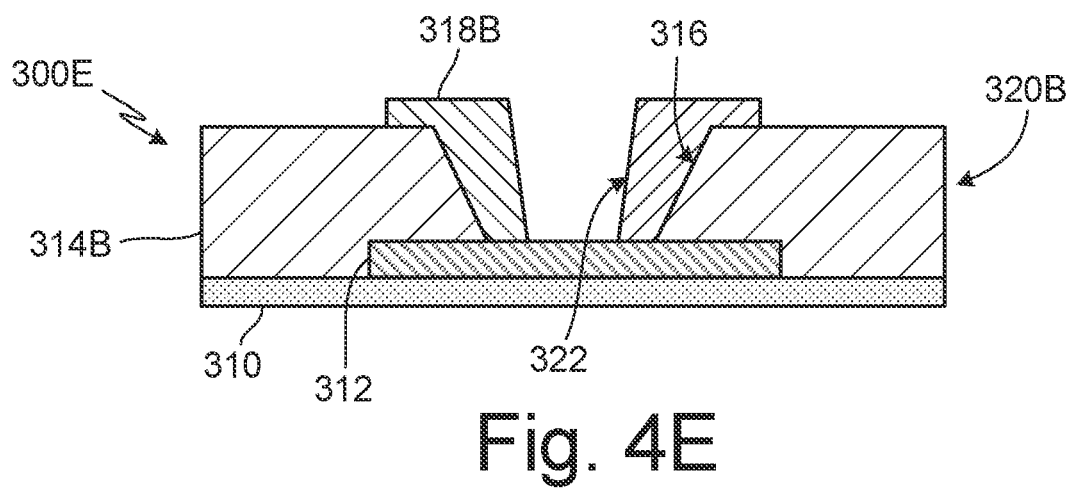
Figure 4F:
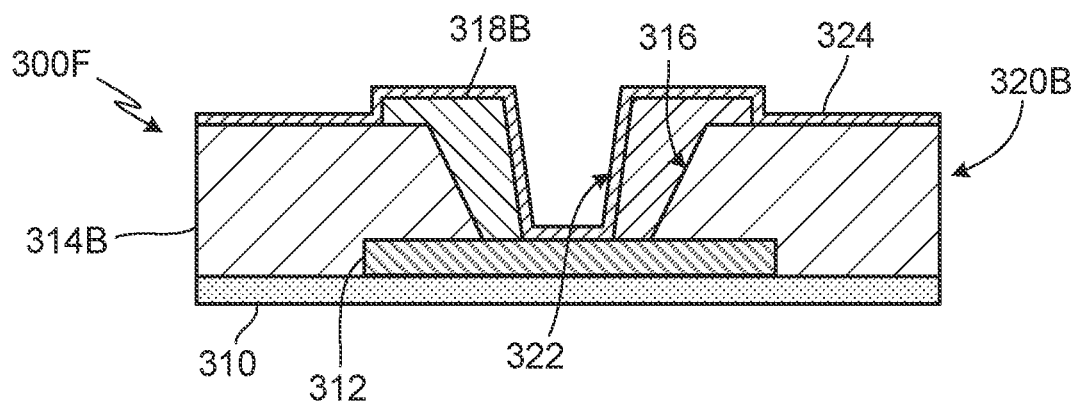

At step 216, secondary coating 318A is exposed and developed (or etched) to pattern secondary coating 318A and form high aspect ratio via 322 within secondary coating 318A and low aspect ratio opening 316. Selecting a developing or etching process can depend on properties of secondary coating 318A. The resulting integrated circuit device WIP 300E includes secondary coating 318B patterned with high aspect ratio via 322 (shown in FIG. 4E). Thus, hybrid coating 320B includes primary coating 314B, low aspect ratio opening 316, secondary coating 318B, and high aspect ratio via 322. As shown in FIG. 4E, an aspect ratio of high aspect ratio via 322 is greater than an aspect ratio of low aspect ratio opening 316. High aspect ratio via 322 exposes contact 312.

At step 218, topside metal 324 is patterned and plated onto wafer 310 on top of exposed portions of primary coating 314B, secondary coating 318B, and contact 312. The resulting integrated circuit device WIP 300F includes hybrid coating 320B and high aspect ratio via 322 (shown in FIG. 4F) at least partially covered by topside metal 324.

Fully fabricated integrated circuit device WIP 300F can be an embodiment of integrated circuit devices 10 and 100 of FIGS. 1-2 and can include any combination of the features described above with respect to FIGS. 1-2. Moreover, the patterning steps described at steps 212 and 216 of process 200 may be used to form multiple pairs of low aspect ratio openings and high aspect ratio vias across a wafer during the same fabrication process.

Figure 5:
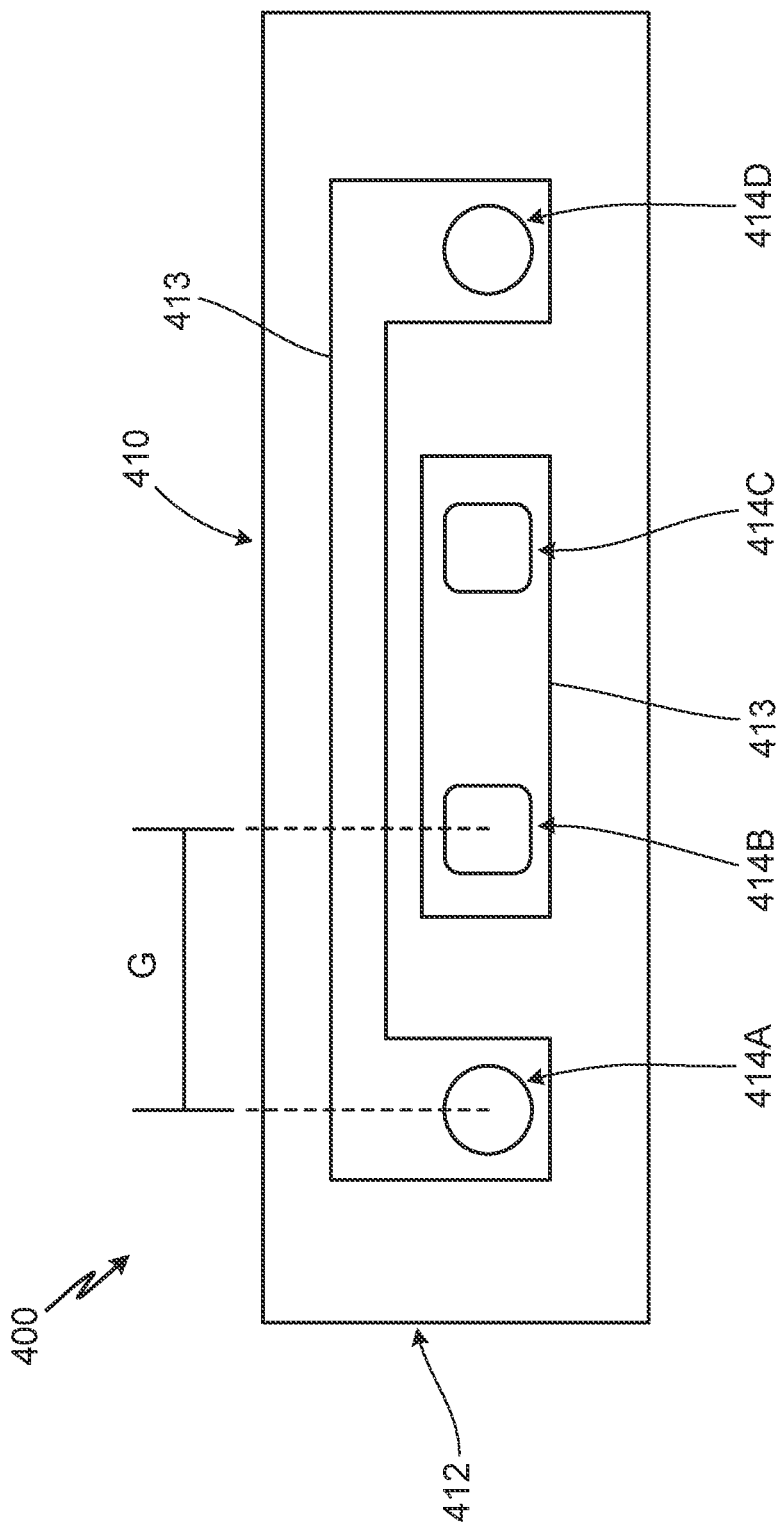
FIG. 5 is a schematic top view of an integrated circuit device showing spacing of high aspect ratio vias in a hybrid coating.

FIG. 5 is a schematic top view of integrated circuit device 400 showing spacing of high aspect ratio vias 414A-414D in hybrid coating 412. Integrated circuit device 400 includes wafer 410, hybrid coating 412, and interconnects 413. Hybrid coating 412 includes vias 414A-414D. Also labeled in FIG. 5 is center-to-center distance G. Integrated circuit device 400 has essentially the same structure and function as described above with reference to integrated circuit devices 10 and 100 in FIGS. 1-2, except integrated circuit device 400 includes multiple vias 414A-414D connected by interconnects 413.

Vias 414A-414D are openings, or channels, formed in hybrid coating 412. Vias 414A-414D are spaced apart within hybrid coating 412. In some examples, a portion of hybrid coating 412 that is between adjacent ones of vias 414A-414D can include both the primary coating (e.g., primary coating 18 or 118 in FIGS. 1-2) and the secondary coating (e.g., secondary coating 22 or 122 in FIGS. 1-2). More specifically, adjacent ones of vias 414A-414D each can be surrounded by the secondary coating, and the primary coating can extend in a space between the surrounded vias. In other examples, the portion of hybrid coating 412 that is between adjacent ones of vias 414A-414D only includes the secondary coating. That is, multiple vias 414 can be formed within the secondary coating that fills a single opening (e.g., opening 20 or 120 in FIGS. 1-2) in the primary coating of hybrid coating 412.

Each of vias 414A-414D can have essentially the same structure and function as described above with reference to via 24 in FIG. 1 and/or via 124 in FIG. 2. FIG. 5 shows integrated circuit device 400 with four vias 414A-414D; however, other examples can include more or fewer vias 414. Integrated circuit device 400 can include any suitable number of vias 414 for a desired circuit topology. Moreover, vias 414A-414D can have any suitable shape, such as circular (e.g., vias 414A and 414D), rectangular, square (e.g., vias 414B and 414C), or any other suitable rounded, polygonal, or irregular shape. Each of vias 414A-414D can have the same shape or different shapes. Any two or more vias 414 can be electrically connected by interconnects (i.e., topside metals) 413.

Adjacent ones of vias 414A-414D are separated by center-to-center distance G. For example, distance G can be less than 90 micrometers (μm). In some examples, distance G can be about 40 μm. Distance G can be about 40 μm when the portion of hybrid coating 412 that is between adjacent ones of vias 414A-414D includes both the primary coating and the secondary coating. In some examples, distance G can be about 20 μm. Distance G can be about 20 μm when the portion of hybrid coating 412 that is between adjacent ones of vias 414A-414D only includes the secondary coating. Distance G can depend on a width of each via 414A-414D and/or an underlying contact (e.g., contact 14 or contacts 114A-114C in FIGS. 1-2) or a desired arrangement of microelectronic features on the surface of wafer 410 (i.e., design rules for the underlying circuitry).

As described above with reference to FIGS. 1 and 2, hybrid coating 412 leverages the properties of the primary coating and the secondary coating in combination to improve performance of integrated circuit device 400. Integrated circuit device 400 retains the benefit of low RF loss over a majority of the surface of wafer 410 due to the low RF loss tangent of the primary coating of hybrid coating 412, which covers a majority of the surface of wafer 410. Integrated circuit device 400 also retains the benefit of high aspect ratio patterning to form high aspect ratio features (e.g., vias 414A-414D) due to strategic use of the secondary coating of hybrid coating 412 in limited locations. Using only one or the other of the primary coating and the secondary coating in place of hybrid coating 412 would increase the RF loss of integrated circuit device 400 and negatively impact performance.

Hybrid coating 412 permits formation of high aspect ratio vias 414A-414D on integrated circuit device 400, which enables a layer of hybrid coating 412 to be used as an interconnect layer for connecting features on top of wafer 410 to features on top of hybrid coating 412 through vias 414A-414D and interconnects 413. When used in this way, hybrid coating 412 also permits feature compaction on the surface of wafer 410. Specifically, contacts (e.g., contact 14 shown in FIG. 1) must be wider than an opening of each respective via 414A-414D because an individual via 414A-414D must land within an exposed contact surface area during fabrication. Accordingly, another connection (another via) must be separated from other ones of vias 414A-414D based at least partly on the size of the contacts. Using larger contacts to accommodate wider (e.g., low aspect ratio) vias means individual vias must be spaced farther apart, and signal strength will be lost on the wafer, especially at high frequencies. High aspect ratio vias 414A-414D can be narrower than conventional vias formed in a material such as BCB, so adjacent ones of vias 414A-414D and underlying features can be positioned closer together on the surface of wafer 410. That is, vias 414A-414D can be positioned closer together in hybrid coating 412 than equivalent vias on a wafer with only the primary coating (e.g., BCB). This feature compaction on the top side of wafer 410 that is enabled by hybrid coating 412 with high aspect ratio vias 414A-414D can allow for a greater density of features on integrated circuit device 400 and/or a smaller device overall.

RF loss can have the most significant impact on performance of an integrated circuit device at high frequencies and where it is desirable to have the most powerful signal possible. Thus, hybrid coating 412 with high aspect ratio vias 414A-414D can be particularly useful for high frequency applications of integrated circuit device 400. For example, hybrid coating 412 with high aspect ratio vias 414A-414D could benefit 5G broadband cellular network technologies and other high frequency GaN on SiC or GaN on Si MMICs Discussion of Possible Embodiments The following are non-exclusive descriptions of possible embodiments of the present invention.

An interconnect layer for an integrated circuit device includes a low radio frequency (RF) loss primary coating that forms a main portion of the interconnect layer, an opening formed in the primary coating, a high aspect ratio patternable secondary coating within the opening, and a via formed in the secondary coating. An aspect ratio of the via is greater than an aspect ratio of the opening.

The interconnect layer of the preceding paragraph can optionally include, additionally and/or alternatively, any one or more of the following features, configurations and/or additional components:

The primary coating can have a different composition than the secondary coating.

The primary coating can be a benzocyclobutene (BCB)-based polymer.

The secondary coating can be a high contrast, epoxy-based, negative photoresist possessing an average of eight epoxide functional groups per moiety (SU-8).

An RF loss tangent of the primary coating can be less than an RF loss tangent of the secondary coating.

An effective thickness of the secondary coating can be at least as thick as a thickness of the primary coating.

The aspect ratio of the via can be greater than 0.6.

The aspect ratio of the via can be greater than 1.0.

A diameter of the via can be less than 60 micrometers (μm), and a thickness of the primary coating can be greater than 20 μm.

The diameter of the via can be less than 20 μm.

The thickness of the primary coating can be greater than 30 μm.

An integrated circuit device includes a wafer, a low radio frequency (RF) loss primary coating at least partially covering the wafer, an opening formed in the primary coating to expose a feature that is positioned on the wafer, a high aspect ratio patternable secondary coating within the opening, and a via formed in the secondary coating. An aspect ratio of the via is greater than an aspect ratio of the opening.

The integrated circuit device of the preceding paragraph can optionally include, additionally and/or alternatively, any one or more of the following features, configurations and/or additional components:

The primary coating can have a different composition than the secondary coating.

The primary coating can be a benzocyclobutene (BCB)-based polymer.

The secondary coating can be a high contrast, epoxy-based, negative photoresist possessing an average of eight epoxide functional groups per moiety (SU-8).

The integrated circuit device can be a monolithic microwave integrated circuit (MMIC).

The integrated circuit device can have an operating frequency that is greater than 10 GHz.

A method of reducing radio frequency (RF) loss from an integrated circuit device includes depositing a low RF loss primary coating onto an integrated circuit device wafer, forming an opening in the primary coating to expose a feature that is positioned on the wafer, depositing a high aspect ratio patternable secondary coating into the opening, and forming a via in the secondary coating.

The method of the preceding paragraph can optionally include, additionally and/or alternatively, any one or more of the following features, configurations operations, and/or additional components:

The primary coating can have a different composition than the secondary coating.

The primary coating can be a benzocyclobutene (BCB)-based polymer; and wherein the secondary coating can be a high contrast, epoxy-based, negative photoresist possessing an average of eight epoxide functional groups per moiety (SU-8).

The method can further include operating the integrated circuit device at a frequency greater than 10 GHz.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An integrated circuit device comprising:
a wafer; and
an interconnect layer at least partially covering the wafer, the interconnect layer comprising:
a low radio frequency (RF) loss primary coating that forms a main portion of the interconnect layer;
a trench formed in and extending through a full thickness of the primary coating to expose a feature that is positioned on the wafer;
a high aspect ratio patternable secondary coating within the trench; and
a via formed in the secondary coating, wherein an aspect ratio of the via is greater than an aspect ratio of the trench.

2. The integrated circuit device of claim 1, wherein the primary coating has a different composition than the secondary coating.

3. The integrated circuit device of claim 2, wherein the primary coating is a benzocyclobutene (BCB)-based polymer.

4. The integrated circuit device of claim 2, wherein the secondary coating is a high contrast, epoxy-based, negative photoresist possessing an average of eight epoxide functional groups per moiety (SU-8).

5. The integrated circuit device of claim 1, wherein an RF loss tangent of the primary coating is less than an RF loss tangent of the secondary coating.

6. The integrated circuit device of claim 1, wherein an effective thickness of the secondary coating is at least as thick as a thickness of the primary coating.

7. The integrated circuit device of claim 1, wherein the aspect ratio of the via is greater than 0.6.

8. The integrated circuit device of claim 7, wherein the aspect ratio of the via is greater than 1.0.

9. The integrated circuit device of claim 1, wherein a diameter of the via is less than 60 micrometers (μm); and wherein a thickness of the primary coating is greater than 20 μm.

10. The integrated circuit device of claim 9, wherein the diameter of the via is less than 20 μm.

11. An integrated circuit device comprising:
a wafer;
a low radio frequency (RF) loss primary coating at least partially covering the wafer;
a trench formed in the primary coating to expose a feature that is positioned on the wafer;
a high aspect ratio patternable secondary coating within the trench; and
a via formed in the secondary coating and bounded by sidewalls of the secondary coating, wherein an aspect ratio of the via is greater than an aspect ratio of the trench.

12. The integrated circuit device of claim 11, wherein the primary coating has a different composition than the secondary coating.

13. The integrated circuit device of claim 12, wherein the primary coating is a benzocyclobutene (BCB)-based polymer.

14. The integrated circuit device of claim 12, wherein the secondary coating is a high contrast, epoxy-based, negative photoresist possessing an average of eight epoxide functional groups per moiety (SU-8).

15. The integrated circuit device of claim 11, wherein the integrated circuit device is a monolithic microwave integrated circuit (MMIC).

16. The integrated circuit device of claim 11, wherein the integrated circuit device has an operating frequency that is greater than 10 GHz.

17. A method of reducing radio frequency (RF) loss from an integrated circuit device, the method comprising:
- depositing a low RF loss primary coating onto an integrated circuit device wafer;
- forming a trench that extends through a full thickness of the primary coating to expose a feature that is positioned on the wafer;
- depositing a high aspect ratio patternable secondary coating into the trench; and
- forming a via in the secondary coating.

18. The method of claim 17, wherein the primary coating has a different composition than the secondary coating.

19. The method of claim 18, wherein the primary coating is a benzocyclobutene (BCB)-based polymer; and wherein the secondary coating is a high contrast, epoxy-based, negative photoresist possessing an average of eight epoxide functional groups per moiety (SU-8).

20. The method of claim 17, and further comprising:
- operating the integrated circuit device at a frequency greater than 10 GHz.

* * * * *